US012463634B2

(12) United States Patent
Lee et al.

(10) Patent No.: US 12,463,634 B2
(45) Date of Patent: Nov. 4, 2025

(54) SYNCHRONIZING TURN-ON/TURN-OFF TIMES OF PARALLEL POWER FETs

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US); Marco Palma, Castagneto Po (IT); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 62 days.

(21) Appl. No.: 18/653,251

(22) Filed: May 2, 2024

(65) Prior Publication Data
US 2024/0372545 A1    Nov. 7, 2024

Related U.S. Application Data

(60) Provisional application No. 63/499,578, filed on May 2, 2023.

(51) Int. Cl.
*H03K 17/10*  (2006.01)
*H03K 17/06*  (2006.01)
*H03K 17/30*  (2006.01)
*H03K 19/0185*  (2006.01)

(52) U.S. Cl.
CPC ......... *H03K 17/102* (2013.01); *H03K 17/063* (2013.01); *H03K 17/302* (2013.01); *H03K 19/01855* (2013.01)

(58) Field of Classification Search
CPC .................................................. H03K 17/102
USPC ........................................................ 327/306
See application file for complete search history.

(56) References Cited

U.S. PATENT DOCUMENTS

2023/0095105 A1 *  3/2023  Brink .................... H02M 1/088
                                                    323/271
2024/0372543 A1 * 11/2024  Chapman ............. H03K 3/0315

* cited by examiner

*Primary Examiner* — Tomi Skibinski
(74) *Attorney, Agent, or Firm* — Blank Rome LLP

(57) ABSTRACT

A circuit for synchronizing the turn-on/turn-off times of parallel FETs. The circuit includes a plurality of integrated circuits and a synchronizer. Each of the integrated circuits includes a power FET which operates in parallel with the power FETs of the other integrated circuits, and a phase detector. The phase detector receives and compares the phase output signal of the integrated circuit with the phase output signal of another integrated circuit, and provides signals to the synchronizer regarding the relative turn-on times of the power FETs based upon the phase output signals. The synchronizer, in response to the signals from each of the integrated circuits, reduces or increases the turn-on times of the power FETs, thereby synchronizing the turn-on times of the power FETs.

10 Claims, 5 Drawing Sheets

| up | dn | Po, Pi & Action |
|---|---|---|
| 0 | 0 | Po & Pi have same phase → no change |
| 0 | 1 | Po leading Pi → increase delay |
| 1 | 0 | Po lagging Pi → reduce delay |
| 1 | 1 | Po & Pi have same phase → no change |

SYNCHRONIZING TURN-ON/TURN-OFF TIMES OF PARALLEL POWER FETs

CROSS-REFERENCE TO RELATED APPLICATION

This application claims the benefit of U.S. Provisional Application No. 63/499,578, filed May 2, 2023, the disclosure of which is incorporated by reference herein in its entirety.

BACKGROUND OF THE INVENTION

1. Field of the Invention

The present invention relates to circuitry for synchronizing the turn-on/turn-off times of power FETs connected in parallel.

2. Description of the Related Art

For high current power applications, it is necessary to connect a number of power FETs in parallel. However, this results in uneven distribution of current flow among the FETs due to: (1) differing $R_{DS(on)}$ among the parallelled power FETs; and (2) differing FET turn-on times due to power FET threshold voltage mismatches and differences in driver delays (driver turn-on is typically slowed to minimize EMI). The resultant unequal current distribution results in different FET temperatures and the possibility of damaging power FETs.

Accordingly, it would be desirable to provide circuitry for synchronizing the turn-on and turn-off times of paralleled power FETs.

SUMMARY OF THE INVENTION

Assuming that different current flows for different power FETs due to differing $R_{DS(on)}$ are within the current ratings of the power FETs, it is only necessary to adjust the FET turn-on/turn-off times of the different power FETs to compensate for different current flows due to voltage threshold mismatches and differences in driver delays.

The present invention addresses the above-noted disadvantages of prior art paralleled power FETs by providing a circuit for synchronizing the turn-on times of parallel FETs. The circuit includes a plurality of integrated circuits and embeds a control circuit ("synchronizer") to synchronize them. Each of the integrated circuits includes a power FET connected in parallel with the power FETs of the other integrated circuits, and a phase detector. The phase detector receives and compares the phase output signal of the integrated circuit with the phase output signal of another integrated circuit, and provides signals to the synchronizer regarding the relative turn-on times of the power FETs based upon the compared phase output signals of the two integrated circuits. The synchronizer, in response to the signals from each of the integrated circuits, reduces or increases the turn-on times of the power FETs, such that the turn-on times of the power FETs are synchronized.

Each integrated circuit can further include a second phase detector, so that the synchronizer can also synchronize the turn-off times of the power FETs.

The circuit of the present invention can be used for synchronizing paralleled low side or high side power FETs of a half bridge circuit.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings, in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1:
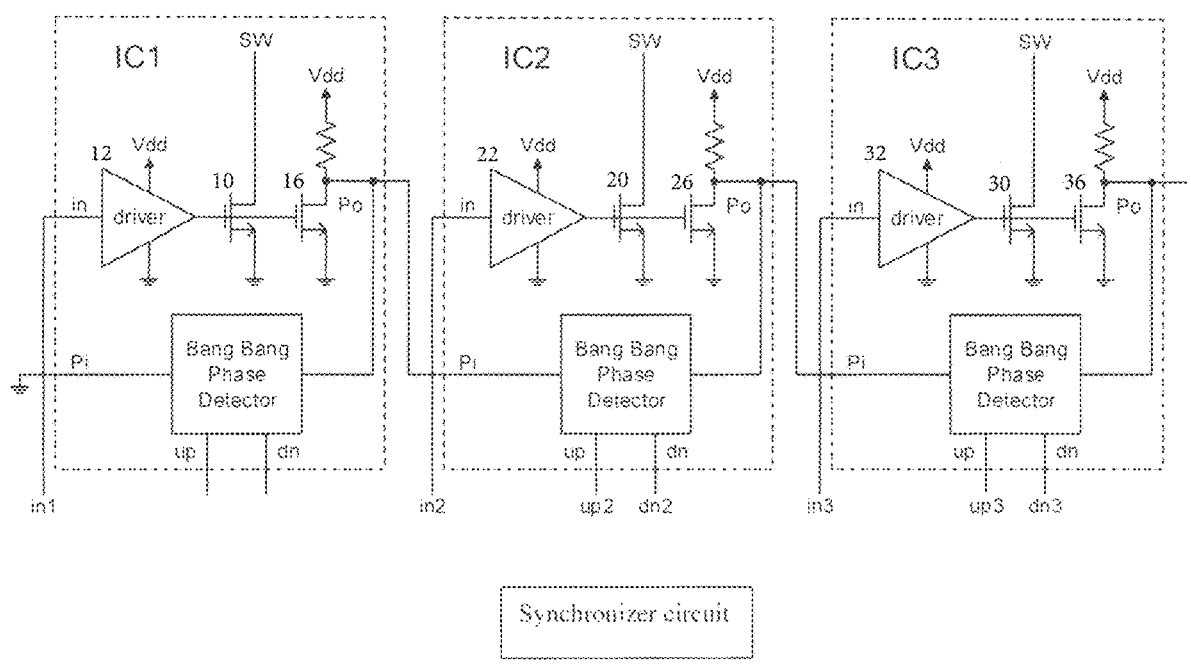
FIG. 1 is a circuit schematic of an embodiment of the present invention directed to a circuit for synchronizing the turn-on/turn-off times of three parallel power FETs for the low side of a half-bridge circuit.

FIG. 1 shows the circuit schematic of an embodiment of the present invention directed to a circuit for synchronizing the turn-on times of three parallel power FETs 10/20/30 for the low side of a half-bridge circuit. Each low side power FET 10/20/30 is provided in a corresponding integrated circuit IC1/IC2/IC3. In addition to the power FET 10/20/30, each IC also includes a corresponding driver 12/22/32, a corresponding phase detector 14/24/34 and a small matching FET 16/26/36. The small matching FETs 16/26/36 each have the same threshold voltage VT as the corresponding power FETs 10/20/30.

Although three power FETs and ICs are illustrated in FIG. 1, the present invention may be used for any number N of power FETs operating in parallel. The circuitry of the present invention is preferably implemented in GaN technology, such that the power FETs, the matching FETs and the FETs in the drivers, are GaN FETs.

The FET turn-on time for power FET 10 in IC1 serves as the reference turn-on time. In accordance with the present invention, the FET turn-on times for power FETs 20 and 30 in IC2 and IC3, respectively, are synchronized to the turn-on time for power FET 10.

The phase output (Po) of each IC is used as the phase input (Pi) for next IC. Alternately, the phase inputs (Pi) of IC2 and IC3 may be connected to the phase output (Po) of IC1. When the power FETs 10/20/30 are on, the corresponding matching FETs 16/26/36 are also on, and the corresponding phase outputs (Po) will switch to logic low. The phase detectors 14/24/34 in each IC compare the phase input (Pi) with the phase output (Po) that is generated within each IC, and generate digital outputs up and dn that are sent to a synchronizer circuit. The synchronizer, which may be, for example, a microcontroller, generates driver inputs (in1/in2/in3) to each IC.

Figure 2:
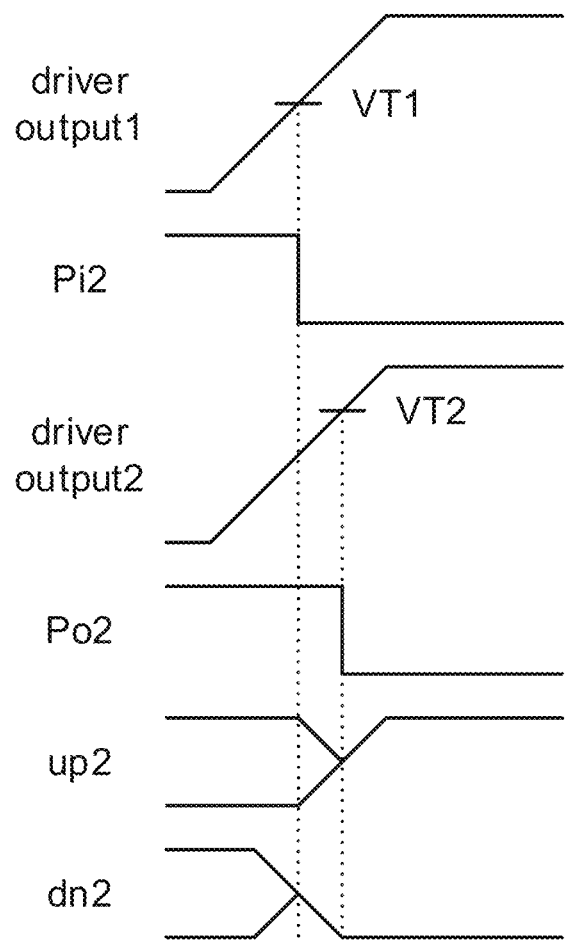
FIG. 2 is a waveform diagram showing the operation of the phase detector in the synchronization process of the present invention.

Referring now to the waveforms shown in FIG. 2, for a power FET (e.g., power FET 20) that turns on slower than the power FET (e.g., power FET 10) of a preceding IC, the phase output Po lags the phase input Pi. As a result, the outputs of the phase detector 24 are up=1 and dn=0, and the synchronizer reduces the phase delay of the input to the driver.

Conversely, for a power FET that turns on faster than the power FET of a preceding IC, the phase output Po leads the phase input Pi, and the outputs of the phase detector are up=0 and dn=1, and the synchronizer increases the phase delay of the input to the driver.

The process described above continues until the phase output Po and the phase input Pi are turning off at approximately the same time, such that the power FET of the IC turns on at approximately as the power FET of the preceding IC.

Figures 3, 4:
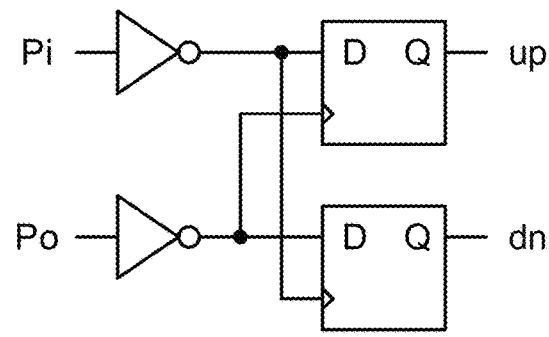
FIG. 3 is a circuit schematic of the bang bang phase detector of the present invention.
FIG. 4 is a table showing the various outputs of the phase detector and the corresponding actions.

The design and function of the phase detectors 14/24/34 will now be described. As shown in FIG. 3, the phase detectors are bang bang detectors, and each includes two inverters and two flip flops. Only the falling edges of Pi and Po are compared. The delay difference between Po and Pi has resolution (corresponding to <up, dn>=00 or 11) approximately equal to the flip flop hold times, which is typically less than 1ns.

As shown in the table of FIG. 4, if Po and Pi have the same phase, up=0 and down=0, and there is no change. If Po leads Pi, the phase detector outputs up=0 and down=1, and the synchronizer increases the delay. Conversely, if Po lags Pi, the phase detector outputs up=1 and down=0, and the synchronizer decreases the delay. If Po and Pi have the same phase, up=1 and down=1, and there is no change.

The present invention, as described above, has a number of significant advantages:
1. The invention is simple to implement in GaN technology.
2. The invention only relies on voltage threshold matching between the power FET and the small matching FET in the same IC. The delay error is approximately equal to the voltage threshold mismatch between the power FET and the small matching FET divided by the driver output slope. Thus, for example, for a voltage threshold mismatch=0.5V and a driver output slope=1V/ns, the delay error will only be 0.5 ns.
3. The invention relies primarily on the processing power and delay resolutions of the synchronizer on controlling input delays.
4. The invention can track with delay changes due to temperature changes during operation, and any power FET and driver delay drifts.

The circuit of the present invention, as described above, synchronizes the turn-on time for power FETs operating in parallel. If an additional phase detector is provided in each IC, the turn-off times for the power FETs can also be synchronized in a similar manner.

If less connections to synchronizer are desired, the up and dn signals can be combined into one signal with an extra flip flop and logic gates in each IC.

Figure 5:
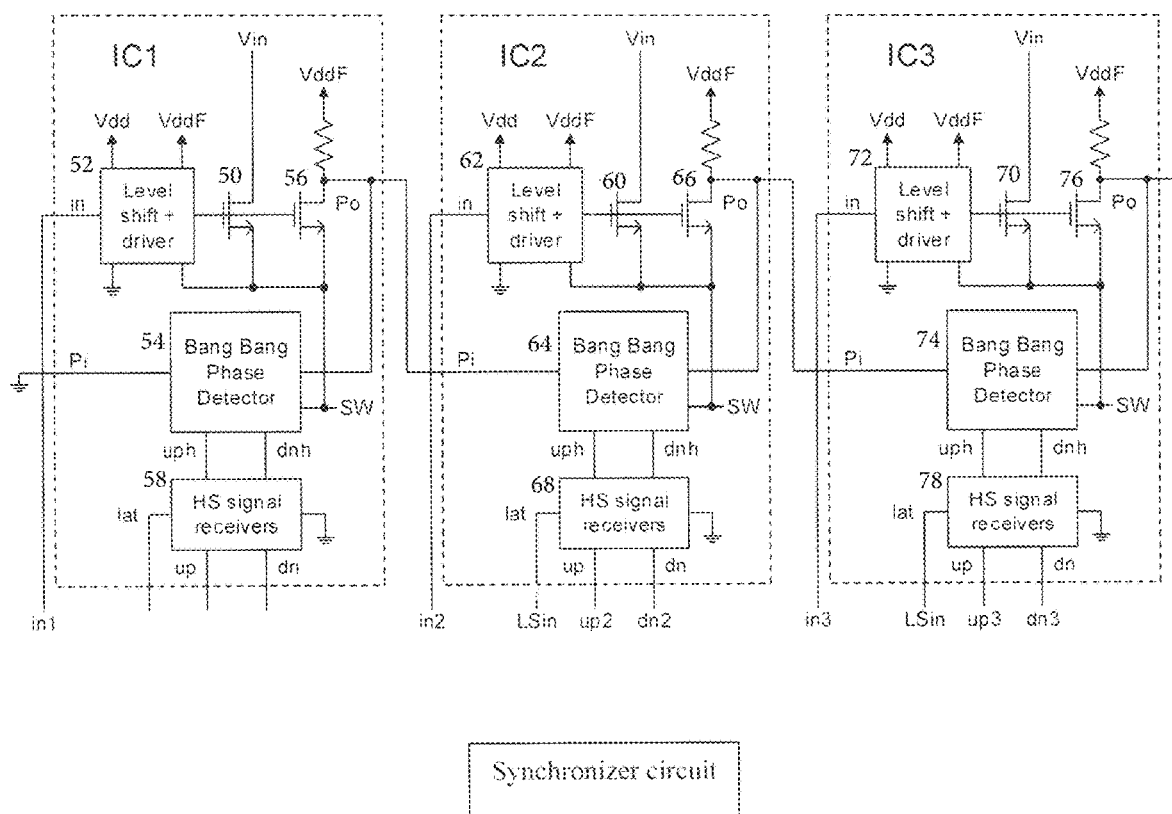
FIG. 5 is a circuit schematic of an embodiment of the present invention directed to a circuit for synchronizing the turn-on/turn-off times of three parallel power FETs for the high side of a half-bridge circuit.

The present invention can advantageously be extended to synchronize the turn-on and turn off times of parallel high side power FETs. Referring to FIG. 5, the circuitry for high side power FET synchronization is similar to the low side circuitry except that the phase outputs (Po) and the phase inputs (Pi) are compared by phase detectors 54/64/74 that are referenced to the half bridge switch node SW. As shown in FIG. 5, high side signal receivers 58/68/78 are used to bring the phase detector results to ground reference, so they can be sent to the synchronizer.

Figure 6:
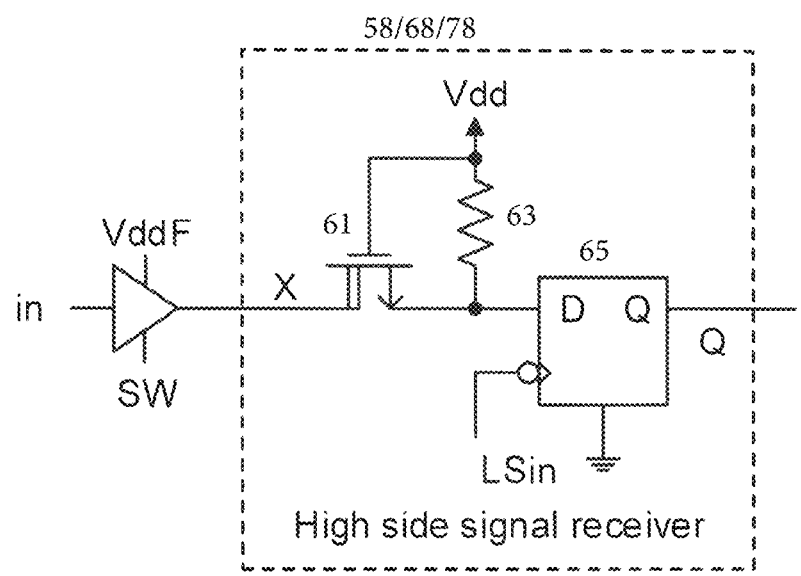
FIG. 6 is a circuit schematic of the high side signal receiver of the present invention.

As shown in FIG. 6, each high side signal receiver includes a FET 61, a resistor 63, and a flip flop 65. Phase detector results are obtained when the high side in =1 and are latched until the next time that the high side in =1 again.

The high side signal receiver circuitry of the present invention operates as follows:

When the low side in (LSin)=1 and the high side in (Hsin)=0, the switch node SW will be at ground.

As seen in FIG. 5, the high side up (uph) or dn signals (dnh) signals output by the phase detector are input "in" of the high side signal receiver of FIG. 6.

The voltage at X of FIG. 6 will be referenced to ground. Hence, the D input of the flip flop=X (and X=in).

The Q output of the flip flop=D when the low side input (LSin)=0, and the signal is sent to the synchronizer.

FET 61 is mainly used for blocking high voltage swings. The up and down (dn) signals are sent to the synchronizer approximately one clock cycle later. However, the delay has no detrimental effect on the operation of the circuit since every delay adjustment will take a number of clock cycles, and the delay differences between the power FETs are relatively constant.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A circuit for synchronizing the turn-on/turn-off times of parallel FETs, comprising:
    a plurality of integrated circuits; and
    a synchronizer;
    wherein each integrated circuit comprises:
        a power FET, wherein the power FET of the integrated circuit operates in parallel with the power FETs of other integrated circuits, and has a phase; and
        a phase output signal representing the phase of the power FET; and
        a phase detector, wherein the phase detector receives and compares the phase output signal of the integrated circuit and the phase output signal of another one of the integrated circuits, and provides at least one signal to the synchronizer regarding the relative turn-on times of the power FETs based upon the phase output signals;
    wherein the synchronizer, in response to the at least one signal from each of the integrated circuits, reduces or increases the turn-on times of the power FETs such the turn-on times of the power FETs are synchronized.

2. The circuit of claim 1, wherein each integrated circuit further comprises a matching FET for generating the phase output signal, the matching FET having the same threshold voltage as the power FET.

3. The circuit of claim 2, wherein power FETs and matching FETs are GaN FETs.

4. The circuit of claim 2, wherein each integrated circuit further comprises a driver for receiving an input signal from the synchronizer, and for providing a corresponding drive signal to the power FET and the matching FET of the integrated circuit.

5. The circuit of claim 1, wherein the phase detector is a bang bang phase detector.

6. The circuit of claim 1, wherein each integrated circuit further comprises a second phase detector, and wherein the synchronizer synchronizes the turn-off times of the power FETs.

7. The circuit of claim 1, wherein the at least one signal output from the phase detector comprises a up signal and a down signal indicating the relative phases of the power FETs in the integrated circuits.

8. The circuit of claim 1, wherein the phase detector is referenced to a switch voltage of a half bridge circuit, and the circuit is adapted to synchronize the turn-on/turn-off times of parallel FETs in the high side of the half bridge circuit.

9. The circuit of claim 8, wherein each integrated circuit further comprises a high side signal receiver for generating at least one signal output referenced to ground.

10. The circuit of claim 9, wherein the at least one signal output from the high side signal receiver comprises a up signal and a down signal indicating the relative phases of the power FETs in the integrated circuits.

* * * * *